US009589702B2

(12) United States Patent
Horii et al.

(10) Patent No.: US 9,589,702 B2
(45) Date of Patent: Mar. 7, 2017

(54) CABLE AND ELECTRONIC DEVICE

(71) Applicant: Sony Corporation, Tokyo (JP)

(72) Inventors: Akihiro Horii, Tokyo (JP); Ken Nishida, Chiba (JP); Kazuki Sano, Kanagawa (JP); Masamichi Kitagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/410,897

(22) PCT Filed: May 22, 2013

(86) PCT No.: PCT/JP2013/064274
§ 371 (c)(1),
(2) Date: Dec. 23, 2014

(87) PCT Pub. No.: WO2014/006996
PCT Pub. Date: Jan. 9, 2014

(65) Prior Publication Data
US 2015/0170793 A1    Jun. 18, 2015

(30) Foreign Application Priority Data

Jul. 5, 2012    (JP) .................................. 2012-151379

(51) Int. Cl.
*H01B 7/08*    (2006.01)
*H01B 7/00*    (2006.01)
(Continued)

(52) U.S. Cl.
CPC ............. *H01B 7/0892* (2013.01); *G02B 6/44* (2013.01); *G02B 6/4416* (2013.01); *H01B 7/00* (2013.01);
(Continued)

(58) Field of Classification Search
USPC ........................................................ 174/68.1
See application file for complete search history.

(56) References Cited

U.S. PATENT DOCUMENTS 7,406,233 B2 *  7/2008  Seddon ................ G02B 6/4494
                                                        385/100
7,536,073 B2 *  5/2009  Seddon ................ G02B 6/4494
                                                        385/100
(Continued)

FOREIGN PATENT DOCUMENTS

EP    2264717 A    12/2010
JP    2002-042567 A    2/2002
(Continued)

OTHER PUBLICATIONS

Microfilm of the specification and drawings annexed to the request of Japanese Utility Model Application No. 117897/1990(Laid-open No. 074815/1992) (Showa Electric Wire & Cable Co., Ltd.), Jun. 30, 1992 (Jun. 6, 1992), entire text; all drawings.
(Continued)

*Primary Examiner* — William H Mayo, III
*Assistant Examiner* — Krystal Robinson
(74) *Attorney, Agent, or Firm* — Oblon, Mcclelland, Maier & Neustadt, L.L.P.

(57) ABSTRACT

A cable including two metal conductor wires, and a coating that is made of a transparent material or a translucent material, covers the two metal conductor wires in a state of being arranged in parallel at an interval, and is shaped in a manner that one of two surfaces existing along a direction substantially parallel to a direction between the two metal conductor wires is a plane and the other surface is a curved surface with a convex cross section.

17 Claims, 8 Drawing Sheets

(51) Int. Cl.
*H01B 11/00* (2006.01)
*H01B 11/22* (2006.01)
*H05K 7/02* (2006.01)
*G02B 6/44* (2006.01)
*H01B 7/18* (2006.01)

(52) U.S. Cl.
CPC ............. *H01B 7/08* (2013.01); *H01B 7/0823* (2013.01); *H01B 11/00* (2013.01); *H01B 11/22* (2013.01); *H05K 7/026* (2013.01); *G02B 6/4403* (2013.01); *G02B 6/4432* (2013.01); *H01B 7/184* (2013.01)

(56) References Cited

U.S. PATENT DOCUMENTS

| | | | | |
|---|---|---|---|---|
| 2006/0171644 | A1* | 8/2006 | Sato | G02B 6/4422 385/114 |
| 2007/0098339 | A1* | 5/2007 | Bringuier | G02B 6/02357 385/106 |
| 2010/0321591 | A1* | 12/2010 | Onomatsu | H01B 7/0823 348/737 |

FOREIGN PATENT DOCUMENTS

| | | |
|---|---|---|
| JP | 2009-048818 A | 3/2009 |
| JP | 2011-003331 A | 1/2011 |
| JP | 2011-041737 A | 3/2011 |

OTHER PUBLICATIONS

Microfilm of the specification and drawings annexed to the request of Japanese Utility Model Application No. 008546/1986(Laid-open No. 121713/1987) (The Furukawa Electric Co., Ltd.), Aug. 1, 1987 (Aug. 1, 1987), entire text; all drawings.

Microfilm of the specification and drawings annexed to the request of Japanese Utility Model Application No. 188961/1983(Laid-open No. 096611/1985) ( Fujitsu Ltd. ) , Jul. 1, 1985 (Jul. 1, 1985), entire text; all drawings.

International Search Report from International Publication PCT/JP2013/064274 mailed Jul. 9, 2013.

European Search Report issued in European Patent Application No. 13812594.3, on Jan. 25, 2016, 7pp.

* cited by examiner

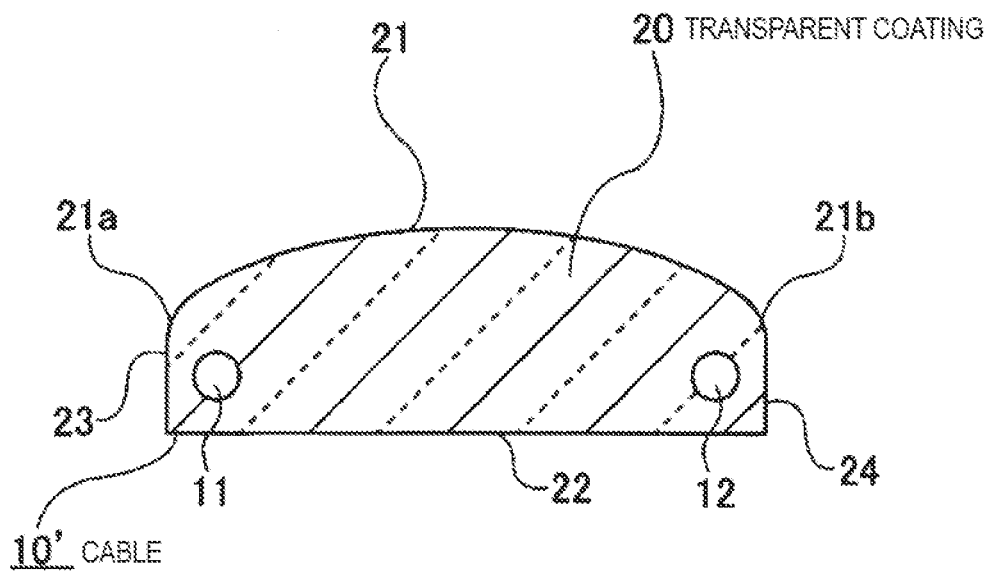
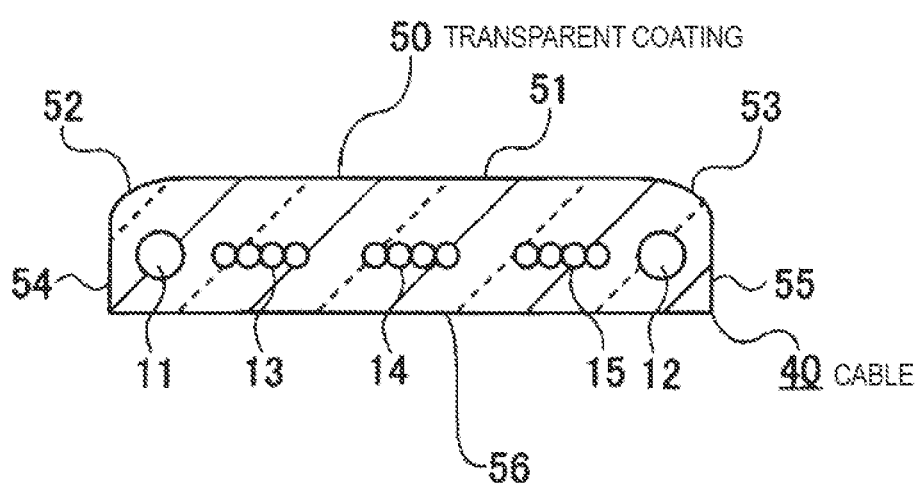

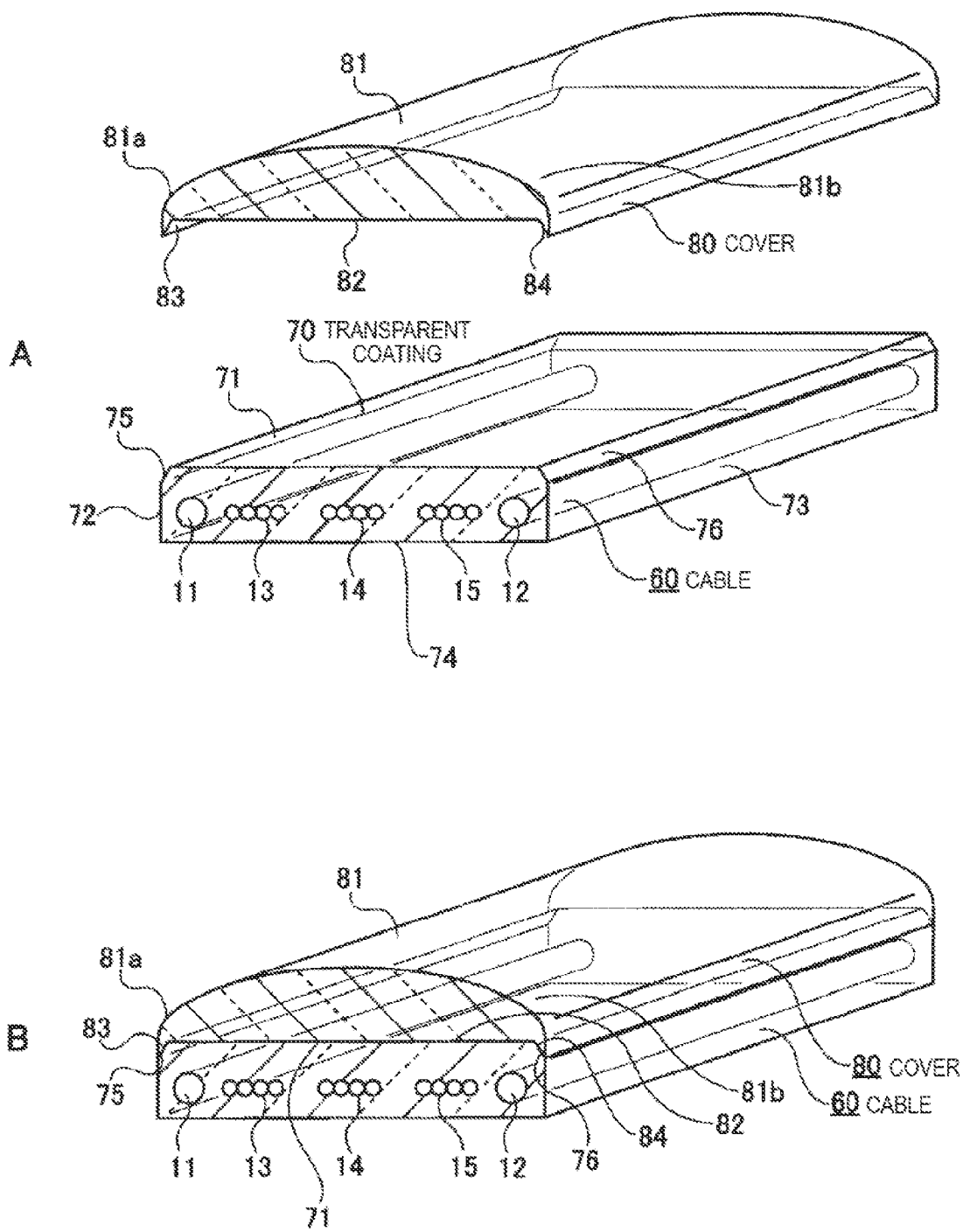

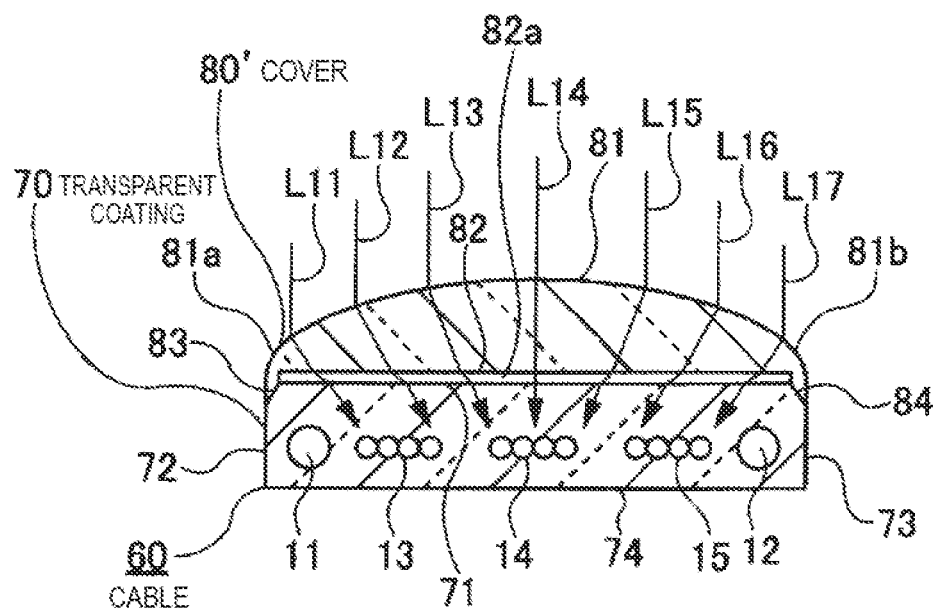
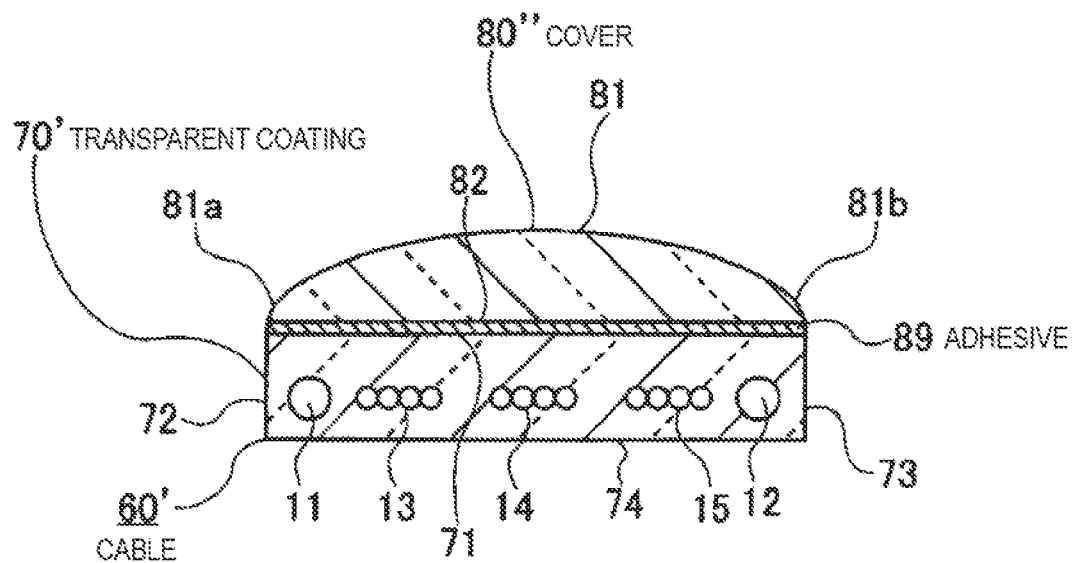

CABLE AND ELECTRONIC DEVICE

CROSS-REFERENCE TO RELATED APPLICATION

The present application is a national phase entry under 35 U.S.C. §371 of International Application No. PCT/JP2013/064274 filed May 22, 2013, published on Jan. 9, 2014 as WO 2014/006996 A1, which claims priority from Japanese Patent Application No. JP 2012-151379 filed in the Japanese Patent Office on Jul. 5, 2012.

TECHNICAL FIELD

The present disclosure relates to a cable having a transparent coating, and an electronic device including the cable.

BACKGROUND ART

Generally, to a video device such as a television receiver, various cables are connected. For instance, in the case of a television receiver, besides a cable for power supply, a cable for video transmission to be connected with another peripheral video device or the like is connected. These cables are generally connected to an inconspicuous part such as a back surface of the television receiver.

Incidentally, one example of a form of installation for a television receiver is the case of a display unit installed on a wall surface. In such a form of installation, when it is impossible to insert the cable in a wall, the cable would be arranged along the wall surface.

Patent Literature 1 describes a cable for a television receiver. The cable described in Patent Literature 1 is so shaped that two power supply lines for supplying power and a plurality of conductor wires to be used as a LAN cable are arranged alongside each other. Then, a flat-shaped coating integrally covers the power supply lines and the conductor wires for the LAN cable arranged alongside each other.

By preparing the flat-shaped cable as described in Patent Literature 1, the cable can be relatively easily arranged in the state of being along a wall or the like.

CITATION LIST

Patent Literature

Patent Literature 1: JP 2011-3331A

SUMMARY OF INVENTION

Technical Problem

With the cable in the flat shape as described in Patent Literature 1, the cable can be arranged along a wall surface and the cable can be arranged so as to be inconspicuous to some extent. However, it is impossible to hide the cable itself.

In order to make the cable arranged on a wall surface or the like inconspicuous, for instance, a coating on the cable may be made transparent. However, even when the coating is made transparent, it is impossible to make the conductor wires in the inside transparent. In particular, a diameter of the conductor wire for the power supply needs to be large since it requires a relatively high current to flow, leaving the conductor wires in the inside conspicuous even when the coating on the cable is made transparent.

An object of the present disclosure is to provide a cable for which conductor wires in the inside are inconspicuous when a coating is made transparent, and an electronic device including the cable.

Solution to Problem

A cable of the present disclosure includes two metal conductor wires and a coating made of a transparent or translucent material covering the two metal conductor wires.

The coating covers the two metal conductor wires in the state of being arranged in parallel at an interval. Further, the coating is so shaped that one of two surfaces existing along a direction substantially parallel to a direction between the two metal conductor wires is a plane and the other surface is a curved surface with a convex cross section.

An electronic device of the present disclosure is the electronic device composed of a first unit and a second unit, and the first unit and the second unit are connected by the cable.

The cable that connects the first unit and the second unit includes two metal conductor wires and a coating made of a transparent or translucent material covering the two metal conductor wires.

The coating covers the two metal conductor wires in the state of being arranged in parallel at an interval. Further, the coating is so shaped that one of two surfaces existing along a direction substantially parallel to a direction between the two metal conductor wires is a plane and the other surface is a curved surface with a convex cross section.

According to the present disclosure, when a user looks at the coating made of the transparent or translucent material on the curved surface from a direction substantially orthogonal to the direction between the two metal conductor wires, the two metal conductor wires become invisible due to refraction of a light beam by the curved surface. Therefore, the cable according to the present disclosure functions as a transparent cable with the invisible metal conductor wires.

Advantageous Effects of Invention

According to the present disclosure, the metal conductor wires inside the coating made of the transparent or translucent material become hard to be seen and it looks like a transparent cable with no metal conductor wires. Therefore, when applied to a cable that connects an electronic device, a cable can be attained which enables the electronic device to be connected in the state that the metal conductor wires are invisible and allows wiring with excellent design.

BRIEF DESCRIPTION OF DRAWINGS

FIG. 5 is a sectional view illustrating a modification (example 1) of the cable according to an embodiment of the present disclosure.

FIG. 6 is a sectional view illustrating a modification (example 2) of the cable according to an embodiment of the present disclosure.

FIG. 7 is a perspective view illustrating a modification (example 3) of the cable according to an embodiment of the present disclosure.

FIG. 9 is a sectional view of the cable in the modification (example 4) illustrated in FIG. 8.

FIG. 10 is a sectional view illustrating a modification (example 5) of the cable according to an embodiment of the present disclosure.

DESCRIPTION OF EMBODIMENTS

An example of a cable and an electronic device according to an embodiment of the present disclosure will be described in the following order with reference to the appended drawings.

Figure 8:
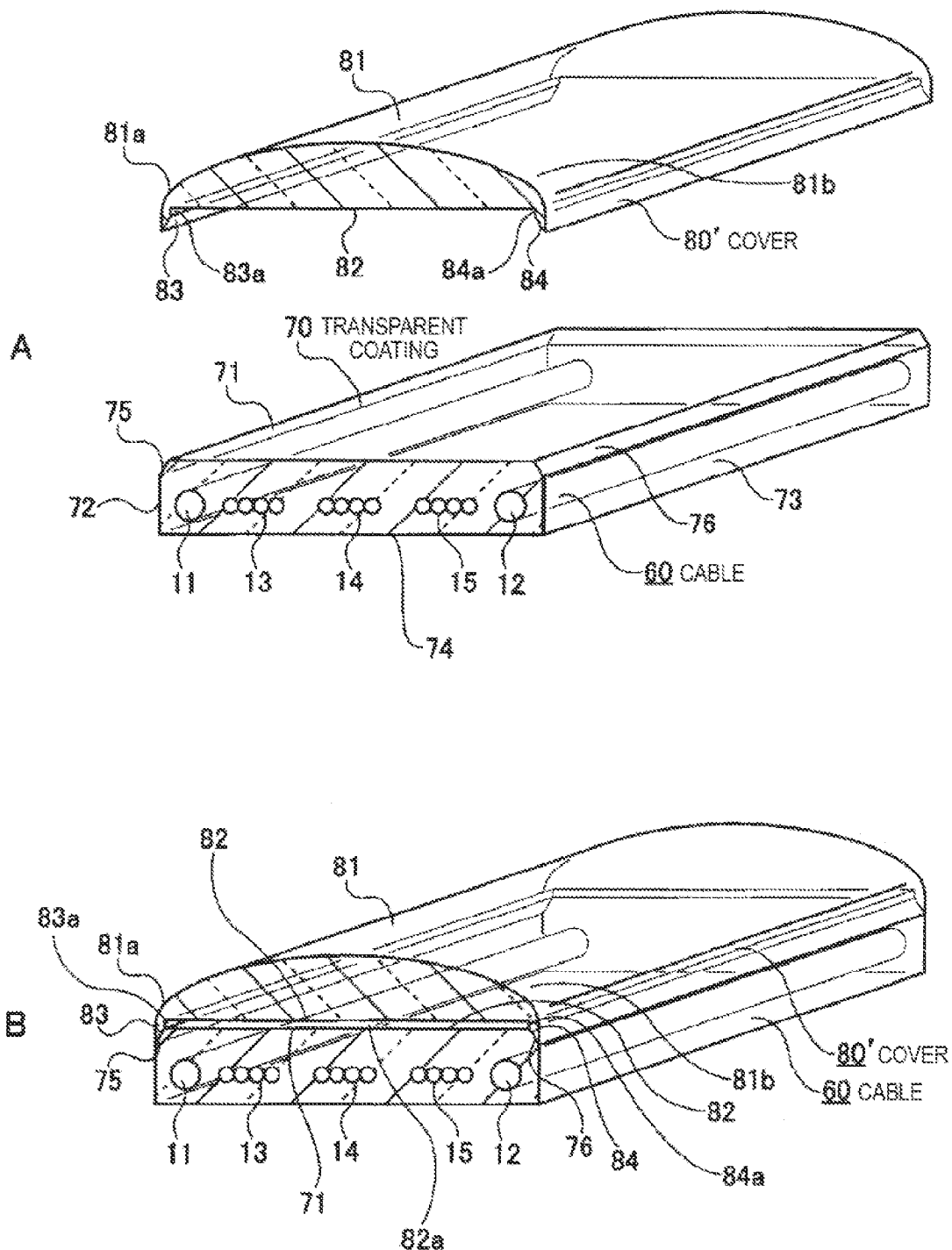
FIG. 8 is a perspective view illustrating a modification (example 4) of the cable according to an embodiment of the present disclosure.
Figure 11:
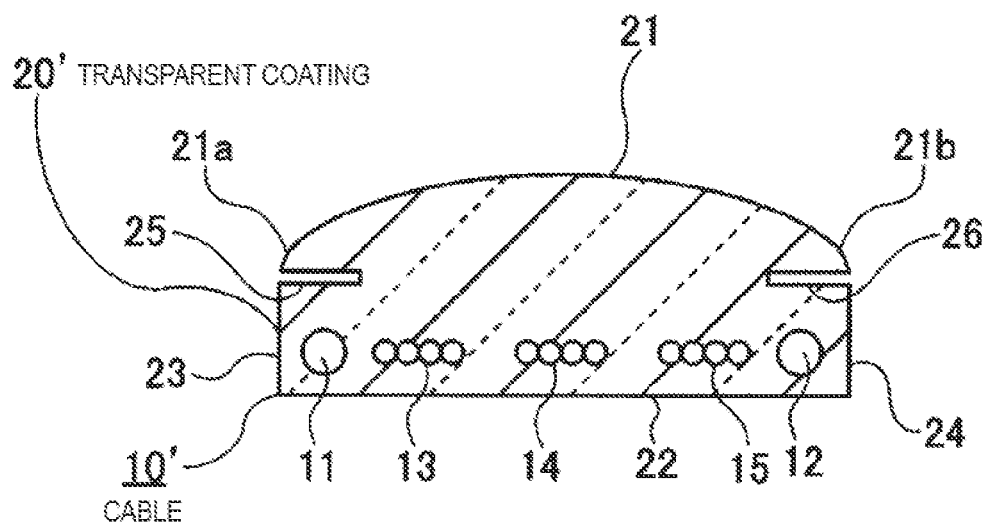
FIG. 11 is a sectional view illustrating a modification (example 6) of the cable according to an embodiment of the present disclosure.
Figure 12:
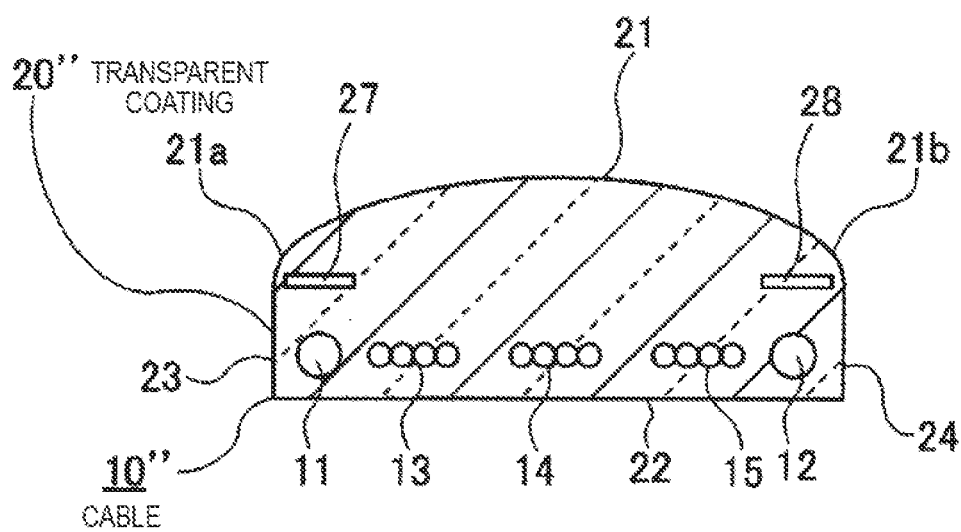
FIG. 12 is a sectional view illustrating a modification (example 7) of the cable according to an embodiment of the present disclosure.

1. Configuration example of cable (FIG. 1-FIG. 2)
2. Example of electronic device incorporating cable (FIG. 3-FIG. 4)
3. Modification of cable (example 1: FIG. 5)
4. Modification of cable (example 2: FIG. 6)
5. Modification of cable (example 3: FIG. 7)
6. Modification of cable (example 4: FIG. 8 and FIG. 9)
7. Modification of cable (example 5: FIG. 10)
8. Modification of cable (example 6: FIG. 11)
9. Modification of cable (example 7: FIG. 12)
10. Other modifications

[1. Configuration Example Of Cable]

Figure 1:
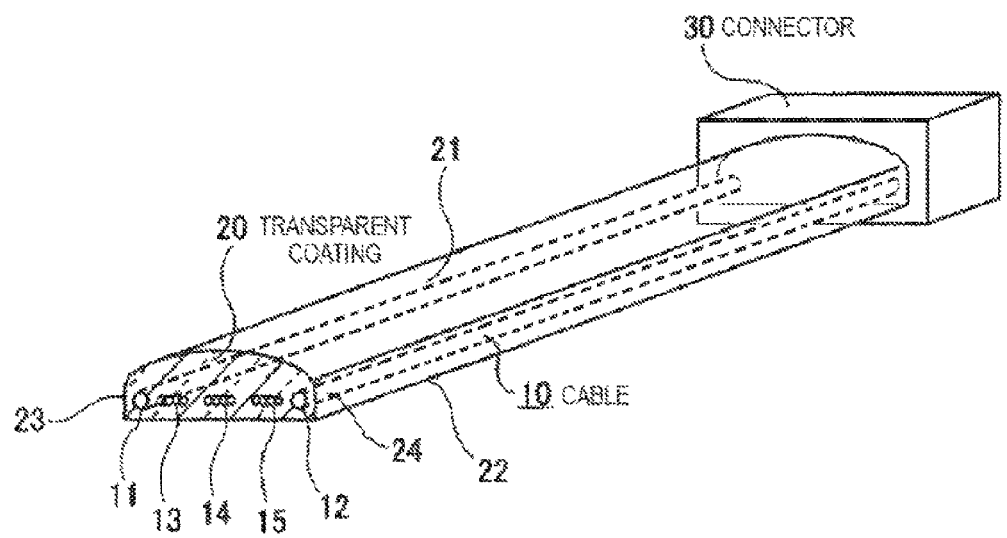
FIG. 1 is a perspective view illustrating a configuration example of a cable according to an embodiment of the present disclosure.
Figure 2:
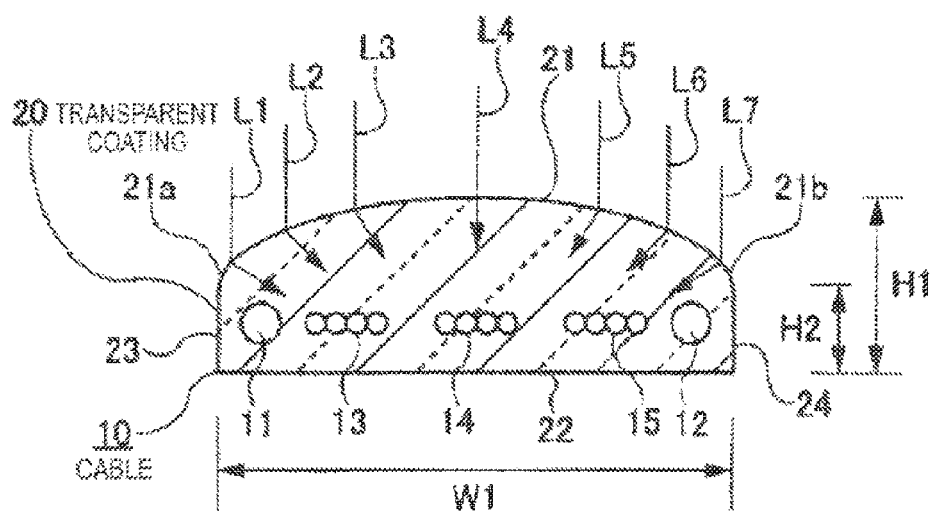
FIG. 2 is a sectional view of the cable according to an embodiment of the present disclosure.

FIG. 1 and FIG. 2 are diagrams illustrating the cable according to an embodiment of the present disclosure. FIG. 1 is a diagram in which a cable 10 is broken in the middle for illustration, and FIG. 2 is a diagram illustrating a cross section where the cable 10 is broken.

For the cable 10, two metal conductor wires 11 and 12 and optical fiber cables 13, 14 and 15 are arranged alongside each other inside a transparent coating 20. For the optical fiber cables 13, 14 and 15, a plurality (four, in this example) of optical fiber cables that are each referred to as an optical fiber ribbon and are bundled alongside each other are used. For the optical fiber cables 13, 14 and 15, a transparent material is used not only for a core wire but also for a resin material covering an outer side of the core wire.

The transparent coating 20 covering the metal conductor wires 11 and 12 and the plurality of optical fiber cables 13, 14 and 15 that are arranged alongside each other in this way is so shaped that a horizontal width is wide and a height direction is narrow.

To one end and the other end of the cable 10, a connector 30 is connected. In FIG. 1, since the cable 10 is cut off in the middle for illustration, only one connector 30 is illustrated.

For a cross sectional shape of a surface vertical to a plane including the two metal conductor wires 11 and 12 of the transparent coating 20, the horizontal width is wide and the height is low. Then, in the transparent coating 20, an upper surface part 21 which is one of the two surfaces including wide sides on the cross section is a curved surface with a convex cross section, and a bottom surface part 22 which is a surface opposing the upper surface part 21 is a plane. Also, side face parts 23 and 24 of the transparent coating 20 are planes. The curved surface at the upper surface part 21 of the transparent coating 20 is the curved surface for which curvatures of shoulder parts 21a and 21b in contact with the side face parts 23 and 24 are large (a radius is small), and a part between one shoulder part 21a and the other shoulder part 21b is the curved surface for which the curvature is small (the radius is large). Also, for the transparent coating 20, the curvature is almost continuously changed at all parts of the upper surface part 21 including the shoulder parts 21a and 21b so that the same curvature does not continue.

Each of the two metal conductor wires 11 and 12 is formed of a metal such as copper having a diameter of about 1 mm. On a surface of the metal conductor wires 11 and 12, a transparent coating is arranged. The coating on the surface of the metal conductor wires 11 and 12 may not be transparent.

Then, in the transparent coating 20, one metal conductor wire 11 is arranged at a position close to one side face part 23, and the other metal conductor wire 12 is arranged at a position close to the other side face part 24. The parts where the individual metal conductor wires 11 and 12 are arranged are close to the shoulder parts 21a and 21b of the curved surface where the curvature is large.

A horizontal width W1 of the transparent coating 20 is about 10 mm for instance, and a height H1 is about 6 mm for instance. Also, a height H2 of the side face parts 23 and 24 is a size (about 1.2 mm for instance) slightly larger than the diameter of the individual metal conductor wires 11 and 12.

The transparent coating 20 is formed of a resin material with a certain degree of flexibility such as polyethylene, vinyl chloride, fluororesin, or polyester for instance. In this case, for the transparent coating 20, it is preferable to choose from materials of refractive indexes approximate to the refractive index of light of the resin material covering the outer side of the optical fiber cables 13, 14 and 15. Also, when the cable 10 does not need to have flexibility, the transparent coating 20 may be formed of a hard resin material such as acryl.

When a user looks at the cable 10 in such a shape from the front, that is an upper side on the side of the upper surface part 21, the two metal conductor wires 11 and 12 become invisible to the user. When describing this point, as illustrated in FIG. 2, when a plane including the two metal conductor wires 11 and 12 is considered, the state that parallel light beams L1-L7 vertical to the plane are made incident on the upper surface part 21 is considered.

At the time, the light beams L1 and L7 made incident on one and the other shoulder parts 21a and 21b forming convex curved surfaces are refracted relatively largely, and are directed to a center side of the transparent coating 20 without passing through the metal conductor wires 11 and 12. Also, the light beams L2, L3, L4, L5 and L6 made incident on the upper surface part 21 of a relatively gentle convex curved surface other than the shoulder parts 21a and 21b are slightly refracted corresponding to respective incident positions. However, the light beam L4 made incident on the almost center of the upper surface part 21 is not refracted since an angle formed with the transparent coating 20 at the incident position is substantially 90 degrees.

In such a manner, since the light beams L1 and L7 made incident on the shoulder parts 21a and 21b of the upper surface part 21 pass through more on the inner side than the two metal conductor wires 11 and 12, the two metal conductor wires 11 and 12 are invisible to the user looking from right above the upper surface part 21. That is, to the user looking from right above the upper surface part 21, a curved surface shape of the upper surface part 21 acts like a convex lens, and the two metal conductor wires 11 and 12 become invisible. In FIG. 2, the parallel light beams L1-L7 orthogonal to a transversal direction connecting the two metal conductor wires 11 and 12 are illustrated; however, even with light beams made incident on the transparent coating 20 not vertical to the bottom surface part 22 but at a certain degree of angle from being vertical, the metal conductor wires 11 and 12 are similarly in an invisible state.

Therefore, to the user looking at the cable 10 from the side of the upper surface part 21, the metal conductor wires 11 and 12 are invisible, and the cable 10 looks like a transparent cable with no metal conductor wires. Further, since the optical fiber cables 13, 14 and 15 are formed of the transparent material, these optical fiber cables 13, 14 and 15 are also in an almost invisible state to the user looking at the cable 10 from the side of the upper surface part 21. In particular, when the transparent coating 20 is the material of the refractive index approximate to the refractive index of light of the resin material covering the outer side of the optical fiber cables 13, 14 and 15, it becomes extremely difficult to recognize a boundary of the optical fiber cables 13, 14 and 15 and the transparent coating 20.

[2. Example Of Electronic Device Incorporating Cable]

Next, an example of an electronic device incorporating the cable 10 will be described with reference to FIG. 3 and FIG. 4.

Figure 3:
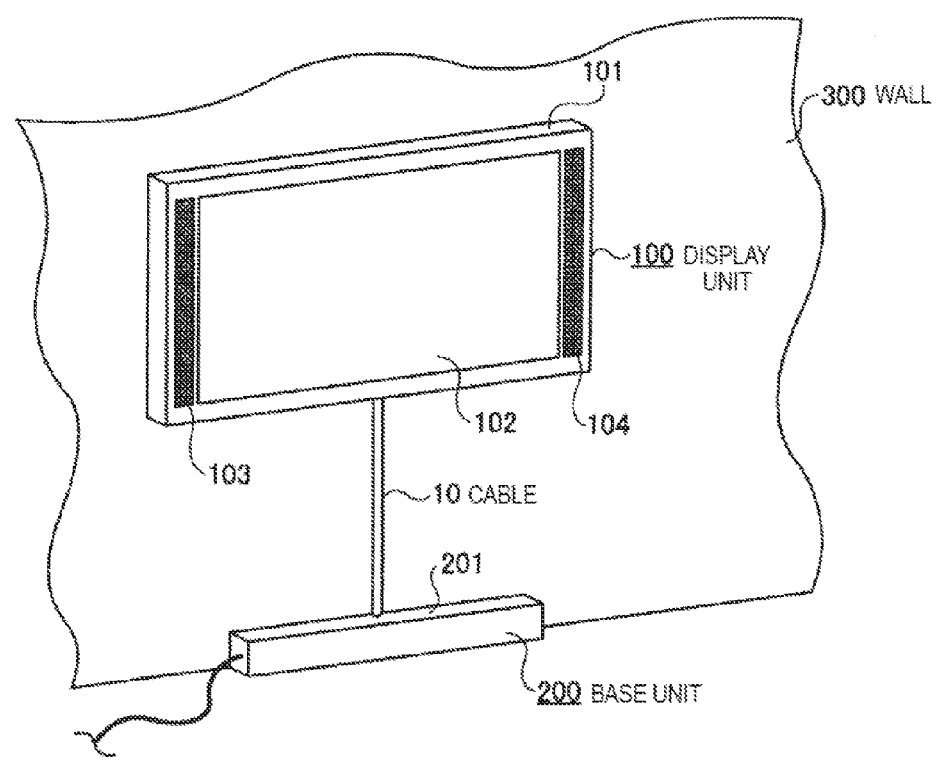
FIG. 3 is a diagram illustrating an installation example of an electronic device to which the cable according to an embodiment of the present disclosure is applied.
Figure 4:
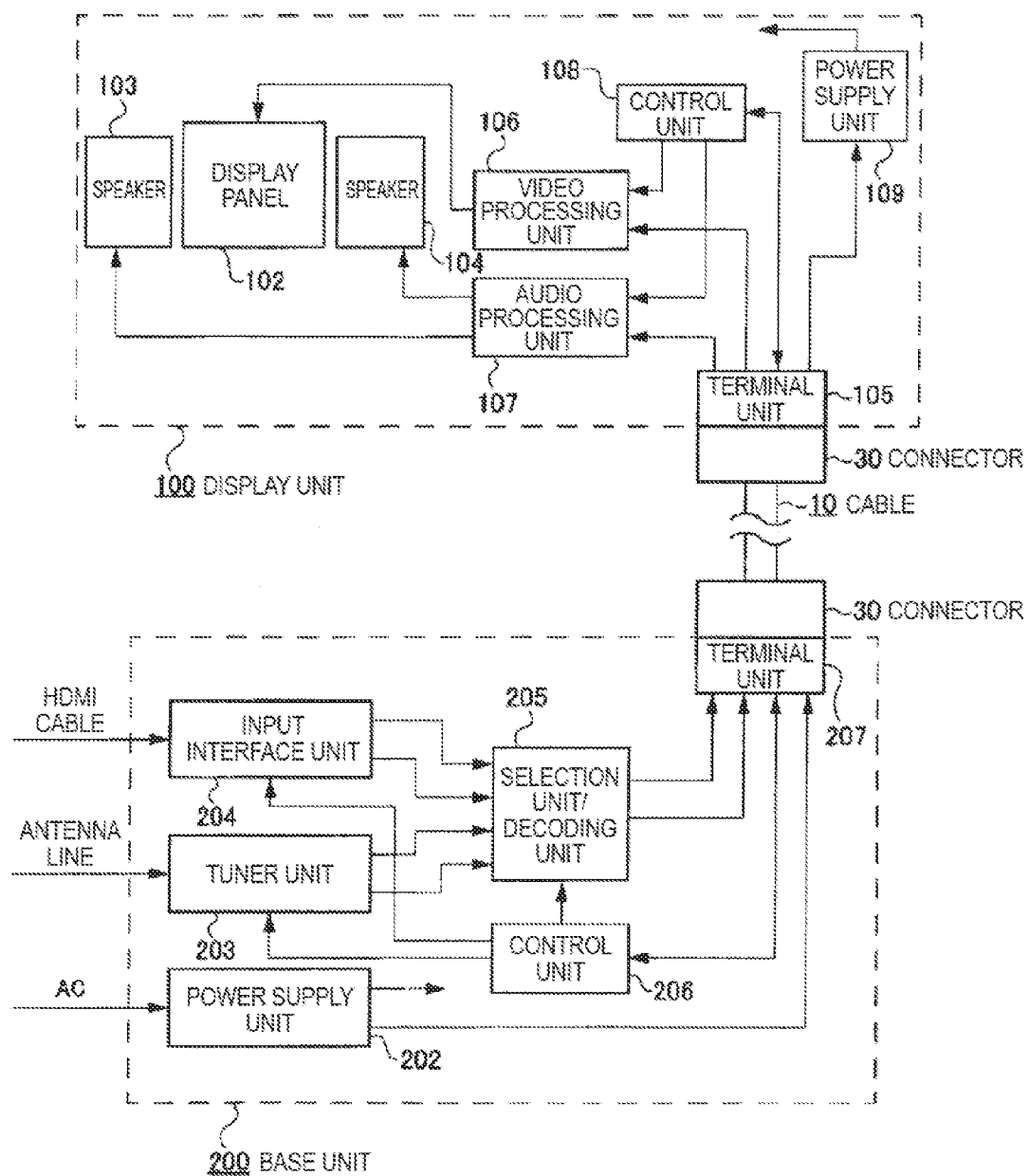
FIG. 4 is a block diagram illustrating a configuration example of the electronic device according to an embodiment of the present disclosure.

An example in FIG. 3 and FIG. 4 is application to a television receiver. The television receiver of this example includes a display unit 100 and a base unit 200. The display unit 100 and the base unit 200 are connected by the cable 10. The cable 10 has the transparent coating 20 described by FIG. 1 and FIG. 2.

FIG. 3 is a diagram illustrating an example of an installation state of the display unit 100 and the base unit 200.

For the display unit 100, a display panel 102 and speakers 103 and 104 are arranged in a housing 101. Then, as illustrated in FIG. 3, the housing 101 is in the state of being attached to a wall 300.

For the base unit 200, a power supply unit and a tuner unit are built inside a housing 201, and power supply, video data and the like to be supplied to the display unit 100 are generated. In the example in FIG. 3, the housing 201 of the base unit 200 is installed on a floor. Then, the cable 10 that connects the base unit 200 and the display unit 100 is stuck to the wall 300 and installed in the state of being vertically erected straight.

In sticking the cable 10 to the wall 300, the planar bottom surface part 22 of the cable 10 illustrated in FIG. 1 is brought into contact with the wall 300. At this time, the cable 10 is stuck to the wall 300 using a transparent adhesive or adhesive tape.

FIG. 4 is a block diagram illustrating the display unit 100 and the base unit 200.

The base unit 200 includes a power supply unit 202. The power supply unit 202 generates DC power supply from inputted AC power supply (such as AC 100V). The power supply unit 202 generates the DC power supply of 48 V for instance to be supplied to the display unit 100, and also generates the DC power supply of a low voltage such as 5 V to be supplied to the individual units inside the base unit 200. The DC power supply of 48 V generated by the power supply unit 202 is supplied to a terminal unit 207.

Also, the base unit 200 includes a tuner unit 203 to which an antenna line is connected. The tuner unit 203 receives television broadcast signals and obtains video data and audio data. The video data and the audio data obtained in the tuner unit 203 are supplied to a selection unit and a decoding unit 205.

Further, the base unit 200 includes an input interface unit 204. To the input interface unit 204, a cable of a high definition multimedia interface (HDMI) standard or the like is connected and the video data and the audio data are inputted. The video data and the audio data obtained in the input interface unit 204 are supplied to the selection unit and the decoding unit 205.

In the selection unit and the decoding unit 205, on the basis of control of a control unit 206, some of the video data and the audio data that are supplied are selected. In this case, for the data supplied from the tuner unit 203 to the selection unit and the decoding unit 205, decoding processing is performed inside the selection unit and the decoding unit 205, and decoded digital baseband signals (video data and audio data) are obtained. Then, the digital baseband signals (video data and audio data) selected by the selection unit and the decoding unit 205 are supplied to a terminal unit 207. Also, the control unit 206 controls a reception channel in the tuner unit 203 and controls input processing in the interface unit 204.

To the terminal unit 207, the connector 30 attached to the cable 10 is connected. Then, the DC power supply obtained at the terminal unit 207 is supplied to the two metal conductor wires 11 and 12 inside the cable 10.

Also, the digital baseband signals (video data and audio data) obtained at the terminal unit 207 are converted to optical signals in a conversion unit inside the terminal unit 207, and the converted optical signals are supplied to one of the optical fiber cables 13, 14 and 15 inside the cable 10.

Further, control data is supplied from the control unit 206 to the terminal unit 207, and is converted into the optical signals in the conversion unit. The control data converted into the optical signals is also supplied to one of the optical fiber cables 13, 14 and 15.

The display unit 100 includes a terminal unit 105. To the terminal unit 105, the connector 30 of the cable 10 is connected. The terminal unit 105 includes a conversion unit that receives the optical signals transmitted through the optical fiber cables 13, 14 and 15 inside the cable 10 and converts them into electric signals. Then, the electric signals (video data, audio data, control data, and the like) as the digital baseband signals converted in the conversion unit are supplied to a video processing unit 106, an audio processing unit 107, and a control unit 108.

The video processing unit 106 performs display drive processing of the display panel 102 on the basis of the supplied video data. The audio processing unit 107 converts the supplied audio data to analog signals. Then, analog audio signals converted in the audio processing unit 107 are supplied to the speakers 103 and 104.

Processing in the video processing unit 106 and the audio processing unit 107 is executed under control of the control unit 108.

Also, the DC power supply supplied through the metal conductor wires 11 and 12 inside the cable 10 is supplied from the terminal unit 105 to a power supply unit 109. The power supply unit 109 generates the DC power supply of a low voltage such as 5 V or 12 V from the supplied DC power supply of 48 V. The DC power supply of the low voltage generated by the power supply unit 109 is supplied to the respective units inside the display unit 100.

In the example illustrated in FIG. 4, the side of the display unit 100 includes the speakers 103 and 104; however, the side of the base unit 200 may include a super woofer which outputs low-frequency sound for instance.

Also, the control unit 206 inside the base unit 200 transmits the control data through the optical fiber cables to the control unit 108 inside the display unit 100; however, the control data may be transmitted in an opposite direction as well. That is, the control unit 206 inside the base unit 200 and the control unit 108 inside the display unit 100 may transmit the control data bidirectionally through one of the optical fiber cables 13, 14 and 15.

Further, the DC power supply supplied to the display unit 100 through the metal conductor wires 11 and 12 inside the cable 10 is defined as 48 V; however, it may be the DC power supply of other voltages. Alternatively, the metal conductor wires 11 and 12 may supply AC power supply.

As illustrated in FIG. 3, in the television receiver of the present disclosure, since the cable 10 connecting the display unit 100 and the base unit 200 looks transparent, it looks as if a power cable or the like is not connected to the display unit 100 at all. The principle that the cable 10 looks transparent is as described already using FIG. 2.

Therefore, it looks as if no cables are connected to the display unit 100 attached to the wall 300 as illustrated in FIG. 3 and an interior design property is improved.

Also, when the cable 10 is looked at from an almost side direction for instance, the metal conductor wires 11 and 12 inside the transparent coating 20 are visible; however, generally, a user who views video images displayed on the display panel 102 of the display unit 100 is often positioned at the almost front of the display panel 102. Therefore, at a normal viewing position, the metal conductor wires 11 and 12 inside the transparent coating 20 are not visible.

In the television receiver of the present disclosure, by supplying the DC power supply of a relatively high voltage that is DC 48 V from the base unit 200 to the display unit 100, a current value can be lowered, and a diameter of the metal conductor wires 11 and 12 for power supply can be narrowed. Thus, in the cable 10 applied to the television receiver of the present disclosure, the diameter of the metal conductor wires 11 and 12 in the inside can be narrowed, and an effect that the metal conductor wires 11 and 12 become inconspicuous can be obtained from this point as well.

Also, since the cable 10 is so shaped that the curvature of the upper surface part 21 of the transparent coating 20 is almost continuously changed and the same curvature does not continue, the light which enters the upper surface part 21 of the transparent coating 20 from the outside is not concentrated on one point of the wall 300. Therefore, in the cable 10, a strong condensing action like a lens is not generated.

[3. Modification (Example 1) Of Cable]

Next, a modification of the cable 10 will be described.

FIG. 5 is a sectional view illustrating a cable 10' of a modification (example 1).

For the cable 10' illustrated in FIG. 5, only the metal conductor wires 11 and 12 are arranged inside the transparent coating 20, and the optical fiber cables are not arranged. The other part of the cable 10' illustrated in FIG. 5 is configured similarly to the cable 10 illustrated in FIG. 1 and FIG. 2.

The metal conductor wires 11 and 12 of the cable 10' illustrated in FIG. 5 are arranged at positions close to the shoulder parts 21a and 21b of the transparent coating 20 similarly to the cable 10 illustrated in FIG. 1.

Also for the cable 10' illustrated in FIG. 5, when the user looks at the transparent coating 20 from the upper side, since the upper surface part 21 of the transparent coating 20 is the curved surface, the metal conductor wires 11 and 12 are in the invisible state.

[4. Modification (Example 2) Of Cable]

FIG. 6 is a sectional view illustrating a cable 40 of a modification (example 2).

The cable 40 illustrated in FIG. 6 is similar to the cable 10 illustrated in FIG. 1 and FIG. 2 on the point that the metal conductor wires 11 and 12 and the optical fiber cables 13, 14 and 15 are arranged inside a transparent coating 50. Then, the cable 40 illustrated in FIG. 6 is so shaped that the upper surface of the transparent coating 50 includes shoulder parts 52 and 53 of the curved surface continued to side face parts 54 and 55 and a planar upper surface part 51 between the individual shoulder parts 52 and 53. A bottom surface part 56 of the transparent coating 50 is in a planar shape.

The metal conductor wires 11 and 12 are arranged at positions close to the shoulder parts 52 and 53 of the curved surface. The optical fiber cables 13, 14 and 15 are arranged so as to be lined alongside each other between the two metal conductor wires 11 and 12.

A curved surface shape of the shoulder parts 52 and 53 is the curved surface of the relatively large curvature (small diameter). In this case, it is preferable that the shoulder parts 52 and 53 be the curved surface shaped in a manner that the curvature is changed so that the curvature is reduced gradually from positions in contact with the side face parts 54 and 55 to positions in contact with the planar upper surface part 51.

Also for the cable 40 illustrated in FIG. 6, when the user looks at the transparent coating 50 from the upper side, since the shoulder parts 52 and 53 of the upper surface of the transparent coating 50 are the curved surfaces, the metal conductor wires 11 and 12 are in the invisible state.

In the case of the cable 40 illustrated in FIG. 6, since the planar upper surface part 51 of the transparent coating 50 is provided, compared to the cable 10 for which the entire upper surface part 21 is the curved surface as illustrated in FIG. 2, the height of the transparent coating 50 can be lowered, and the cable 40 can be thinned.

[5. Modification (Example 3) Of Cable]

FIG. 7 is a perspective view illustrating a cable 60 of a modification (example 3). The cable 60 of the example in FIG. 7 is provided with a cover 80 separate from the cable 60. FIG. 7A illustrates the state that the cable 60 and the cover 80 are separated, and FIG. 7B illustrates the state that the cable 60 and the cover 80 are united.

As illustrated in FIG. 7A, the cable 60 includes a transparent coating 70 shaped in a manner that that the horizontal width is wide and the height direction is low. In the transparent coating 70, an upper surface part 71, side face parts 72 and 73, and a bottom surface part 74 are planes respectively. Between the upper surface part 71 and the side face parts 72 and 73, notched parts 75 and 76 for which corners are cut off when viewed on the cross section are provided. The notched parts 75 and 76 are provided continuously in a longitudinal direction of the cable 60.

Inside the transparent coating 70, the metal conductor wires 11 and 12 and the optical fiber cables 13, 14 and 15 are arranged alongside each other. In this case, the metal conductor wire 11 is arranged at a position close to the side face part 72, and the metal conductor wire 12 is arranged at a position close to the side face part 73.

Then, the cover 80 is formed of a transparent resin material and is in a shape to be mounted on the upper surface part 71 of the transparent coating 70 of the cable 60. That is, a bottom surface part 82 of the cover 80 is in a planar shape corresponding to the upper surface part 71 of the transparent coating 70. Further, the cover 80 includes projection parts 83 and 84 in a shape corresponding to the notched parts 75 and 76 of the transparent coating 70.

Also, an upper surface part 81 of the cover 80 is in a convex curved surface shape. In this case, for the upper surface part 81 in the curved surface shape, the curvature of shoulder parts 81a and 81b is increased, and the curvature of the parts other than the shoulder parts 81a and 81b is reduced.

As illustrated in FIG. 7B, by mounting the cover 80 on the upper surface part 71 of the transparent coating 70 of the cable 60, the cable 60 and the cover 80 are united. At this time, for instance, a transparent adhesive or adhesive tape is arranged between the upper surface part 71 of the transparent coating 70 and the bottom surface part 82 of the cover 80. Alternatively, the projection parts 83 and 84 of the cover 80 may be so shaped that the cover 80 cannot be detached from the cable 60 when fitted to the notched parts 75 and 76 of the transparent coating 70 on the side of the cable 60 so that the adhesive or the adhesive tape is not needed.

As illustrated in FIG. 7B, when the cable 60 and the cover 80 are united, the metal conductor wires 11 and 12 inside the transparent coating 70 become hard to be seen similarly to the cable 10 illustrated in FIG. 1 and FIG. 2. That is, to the user who looks at the cable 60 from the side right above the upper surface part 81 of the cover 80, the two metal conductor wires 11 and 12 become invisible due to refracting action of the light by the shoulder parts 81a and 81b. The principle that the two metal conductor wires 11 and 12 become invisible is the same as the principle described for the cable 10 using FIG. 2.

In this way, by attaching the cover 80, for the cable 60, the two metal conductor wires 11 and 12 become invisible from the outer side. In this case, in the state of detaching the cover 80 from the cable 60, it functions as a normal cable for which the two metal conductor wires 11 and 12 are not hidden. Therefore, the cover 80 which is a separate member should be attached only when it is desired to hide the two metal conductor wires 11 and 12 for the cable 60, and the cable 60 can cope with various installation states of the cable.

[6. Modification (Example 4) Of Cable]

FIG. 8 and FIG. 9 are diagrams illustrating the cable 60 of a modification (example 4). For the cable 60 of the example in FIG. 8, the shape of the cover 80 illustrated in FIG. 7 is changed. That is, a transparent cover 80' of this example includes the projection parts 83 and 84 in the shape corresponding to the notched parts 75 and 76 of the transparent coating 70, and the individual projection parts 83 and 84 are provided with step parts 83a and 84a, as shown in FIG. 8A. The shapes of the other part of the cover 80' and the cable 60 illustrated in FIG. 8 are the same as the shapes of the cable 60 and the cover 80 illustrated in FIG. 7.

By providing the step parts 83a and 84a, as illustrated in FIG. 8B, when the cable 60 and the cover 80' are united, in the cable 60, a slight gap 82a is generated between the upper surface part 71 of the transparent coating 70 and the bottom surface part 82 of the cover 80. The gap 82a is an air layer where an adhesive or the like is not arranged. At the gap 82a (air layer), the upper surface part 71 of the transparent coating 70 and the bottom surface part 82 of the cover 80 become close at a distance of about several mm for instance.

FIG. 9 is a diagram illustrating a cross section in the state that the cable 60 and the cover 80' are united.

FIG. 9 illustrates the state that, in consideration of a plane including the two metal conductor wires 11 and 12, parallel light beams L11-L17 vertical to the plane are made incident on the cover 80' and the cable 60.

The light beams L11 and L17 made incident on one and the other shoulder parts 81a and 81b of the cover 80' forming the convex curved surface are refracted relatively largely and directed to the center side of the transparent coating 20 without passing through the metal conductor wires 11 and 12. At this time, when the individual light beams L11 and L17 are emitted from the cover 80' to the gap 82a which is the air layer, they are refracted further to the center side corresponding to the refractive index that the material of the cover 80' has. Also, when the individual light beams L11 and L17 are made incident on the cable 60 from the gap 82a, they are refracted corresponding to the refractive index that the transparent coating 70 has. However, refracting directions are opposite when they are emitted from the cover 80' to the air layer and when they are made incident on the transparent coating 70 of the cable 60 from the air layer, and the light beams passing through the cover 80' and the light beams passing through the transparent coating 70 of the cable 60 become parallel.

By the presence of the gap 82a which is the air layer in such a manner, the light beams are shifted to the inner side according to a thickness of the gap 82a. In particular, the light beams made incident on positions closer to the shoulder parts 81a and 81b rather than the center are shifted largely to the inner side.

Therefore, as illustrated in FIG. 9, when the cable 60 and the cover 80' are united, the metal conductor wires 11 and 12 inside the transparent coating 70 become hard to be seen. At this time, compared to the shape without the air layer between the cable 60 and the cover 80 as illustrated in FIG. 7 for instance, since the above-described action of shifting to the inner side works, the two metal conductor wires 11 and 12 become harder to be seen. Thus, for instance, the cover 80' illustrated in FIG. 8 can be made thinner than the cover 80 illustrated in FIG. 7.

Also, in the example of FIG. 8 and FIG. 9, the cable 60 and the cover 80' are brought into contact with each other at two parts of the notched parts 75 and 76 of the transparent coating 70 and the projection parts 83 and 84 of the cover 80'. Meanwhile, a projection for bringing the upper surface part 71 of the transparent coating 70 and the bottom surface part 82 of the cover 80 into contact with each other may be provided on the almost center part of the gap 82a for instance.

[7. Modification (Example 5) Of Cable]

FIG. 10 is a sectional view illustrating a cable 60' and a cover 80" of a modification (example 5).

The cable 60' and the cover 80" of this example are fixed by being bonded with a transparent adhesive 89 of a fixed thickness as illustrated in FIG. 10. In this case, the cable 60' is not provided with the notched parts 75 and 76 illustrated in the cable 60 in FIG. 7, and the cover 80" is not provided with the projection parts 83 and 84 illustrated in the cover 80 in FIG. 7. The other shapes of the cable 60' and the cover 80" are the same shapes as the cable 60 and the cover 80 illustrated in FIG. 7.

The adhesive 89 between the upper surface part 71 of the cable 60' and the bottom surface part 82 of the cover 80" is a layer having a thickness of about several mm for instance. Also, for the adhesive 89, the one of the refractive index different from that of a transparent resin forming the cover 80" and the transparent coating 70 (the one of the small refractive index) is used.

In this way, since the refractive index of the adhesive 89 is different from that of the transparent resin forming the cover 80" and the transparent coating 70, similarly to the case of providing the air layer (gap 82a) illustrated in FIG. 9, the light beams directed from the cover 80" to the side of the cable 60' are refracted further at the boundary with the adhesive 89. Further, the light beams are refracted in the opposite direction at the boundary of the adhesive 89 and the cable 60' and are shifted to the inner side.

Thus, also for the cable 60' with which the cover 80" is united, which is illustrated in FIG. 10, the action that the metal conductor wires 11 and 12 inside the transparent coating 70 become hard to be seen strongly works.

[8. Modification (Example 6) Of Cable]

FIG. 11 is a perspective view illustrating the cable 10' of a modification (example 6).

For the cable 10' illustrated in FIG. 11, the shape of the cable 10 illustrated in FIG. 1 and FIG. 2 is changed.

The cable 10' illustrated in FIG. 11 is similar to the cable 10 illustrated in FIG. 1 and FIG. 2 on the point that the metal conductor wires 11 and 12 and the optical fiber cables 13, 14 and 15 are arranged inside a transparent coating 20'. Also, it is similar to the cable 10 illustrated in FIG. 1 and FIG. 2 on the point that the upper surface part 21 of the transparent coating 20' is the convex curved surface.

Then, the cable 10' of this example is provided with cut parts 25 and 26 extending horizontally (a width direction of the transparent coating 20') from the side face parts 23 and 24 on the upper side (near the upper surface part 21) of the metal conductor wires 11 and 12 arranged inside the transparent coating 20', as illustrated in FIG. 11.

The cut parts 25 and 26 are arranged continuously in a longitudinal direction of the cable 10'. Also, a depth (length in the transversal direction in FIG. 11) of the cut parts 25 and 26 overlaps with at least a position where the upper side of the metal conductor wires 11 and 12 is arranged. The cut parts 25 and 26 are not filled with any material so that the cut parts 25 and 26 function as the air layer.

By attaining such a shape, when the light beams made incident on the upper surface part 21 which is the convex curved surface of the cable 10' pass through the cut parts 25 and 26 functioning as the air layer, the light beams are shifted in parallel to the inner side. Therefore, the metal conductor wires 11 and 12 inside the transparent coating 20' become harder to be seen. The principle of such strong refraction by the presence of the air layer is the same as the principle described using FIG. 9.

Also, in the example of FIG. 11, the cut parts 25 and 26 may be filled with a transparent material of the refractive index different from that of the transparent coating 20'.

[9. Modification (Example 7) Of Cable]

FIG. 12 is a sectional view illustrating a cable 10" of a modification (example 7).

The cable 10" illustrated in FIG. 12 is provided with cavity parts 27 and 28 instead of the cut parts 25 and 26 provided in the cable 10' illustrated in FIG. 11.

That is, the cavity parts 27 and 28 that extend horizontally (the width direction of the transparent coating 20') are provided on the upper side (near the upper surface part 21) of the metal conductor wires 11 and 12 arranged inside a transparent coating 20".

The cavity parts 27 and 28 are arranged continuously in the longitudinal direction of the cable 10". The cavity parts 27 and 28 are not filled with any material so that the cavity parts 27 and 28 function as the air layer.

By attaining such a shape, the light beams made incident on the upper surface part 21 which is the convex curved surface of the cable 10" are refracted when passing through the cavity parts 27 and 28 functioning as the air layer, and are shifted to the inner side. Therefore, similarly to the case of the cable 10' illustrated in FIG. 11, the metal conductor wires 11 and 12 inside the transparent coating 20" become harder to be seen. The principle of such strong refraction by the presence of the air layer is the same as the principle described using FIG. 9.

Also, in the example of FIG. 12, the cavity parts 27 and 28 may be filled with a transparent material of the refractive index different from that of the transparent coating 20". Also, while the example of providing the two cavity parts 27 and 28 is illustrated in the example of FIG. 12, a cavity part of a width is slightly shorter than the horizontal width of the transparent coating 20", and for which the two cavity parts 27 and 28 are connected into one, may be provided.

[10. Other Modifications]

Also, in the examples of the embodiment described above, the coating on the cables 10, 40 and 60 is formed of the transparent resin material. Meanwhile, as the cables 10, 40 and 60, the coating may be formed of a translucent material. For the translucent coating, a resin material colored in some color may be used.

Also, in the examples of the embodiment described above, the optical fiber cables 13, 14 and 15 inside the cable are arranged alongside each other. Meanwhile, the optical fiber cables 13, 14 and 1 are not always needed to be alongside each other. For instance, the plurality of optical fiber cables may be arranged in two rows. The number of the optical fiber cables to be arranged inside the cable may be selected according to the electronic device to be connected as well.

Also, in the examples of the embodiment described above, as the electronic device to which the cable 10 is attached, the television receiver is illustrated. Meanwhile, the other various electronic devices may include the cable 10. Also, the power supply to be supplied through the cable 10 is defined as DC 48 V. Meanwhile, the cable 10 may supply the DC power supply of the other voltage or the AC power supply. Also, the metal conductor wires 11 and 12 of the cable 10 are defined as power supply paths. Meanwhile, the metal conductor wires 11 and 12 may be a transmission line of digital data such as the video data and the audio data.

The present disclosure may also be configured as below.

(1)

A cable including:

two metal conductor wires; and a coating that is made of a transparent material or a translucent material, covers the two metal conductor wires in a state of being arranged in parallel at an interval, and is shaped in a manner that one of two surfaces existing along a direction substantially parallel to a direction between the two metal conductor wires is a plane and the other surface is a curved surface with a convex cross section.

(2)

The cable according to (1), wherein a light beam incident on the curved surface from a direction vertical to a plane at least including the two metal conductor wires is refracted by the curved surface and does not pass through the two metal conductor wires.

(3)

The cable according to (1) or (2), wherein a curvature of the curved surface is gradually changed so that the same curvature does not continue.

(4)

The cable according to any one of (1) to (3), wherein, for the other surface, a vicinity of each metal conductor wire is a curved surface and the curved surface in the vicinity of each metal conductor wire is connected by a plane.

(5)

The cable according to any one of (1) to (4), wherein an optical fiber cable is arranged between the two metal conductor wires.

(6)

The cable according to (5), wherein the coating is made of a material of a refractive index approximate to a refractive index of light of a resin material covering an outer side of the optical fiber cable.

(7)

The cable according to any one of (1) to (6), wherein the other surface having the curved surface of the coating is a different member made of a transparent material or a translucent material.

(8)

The cable according to (7), wherein a layer of a different refractive index is provided between the coating and the different member.

(9)

The cable according to (8), wherein the layer of the different refractive index is an air layer.

(10)

The cable according to any one of (1) to (6), wherein a cut or a cavity is provided between the curved surface with the convex cross section of the coating and an arrangement part of the metal conductor wire.

(11)

An electronic device composed of a first unit and a second unit, the electronic device including:

two metal conductor wires; and a coating that is made of a transparent material or a translucent material, covers the two metal conductor wires in a state of being arranged in parallel at an interval, and is shaped in a manner that one of two surfaces existing along a direction substantially parallel to a direction between the two metal conductor wires is a plane and the other surface is a curved surface with a convex cross section, as a cable that connects the first unit and the second unit.

(12)

The electronic device according to (11), wherein a light beam incident on the curved surface from a direction vertical to a plane at least including the two metal conductor wires is refracted by the curved surface and does not pass through the two metal conductor wires.

(13)

The electronic device according to (11) or (12), wherein the first unit includes a power supply unit, wherein the second unit includes a display panel, and wherein power supply obtained in the power supply unit of the first unit is supplied to the second unit through the two metal conductor wires of the cable.

(14)

The electronic device according to any one of (11) to (13), wherein an optical fiber cable is arranged between the two metal conductor wires, and wherein video data obtained in the first unit is supplied to the second unit through the optical fiber cable.

Further, configurations and processing described in claims of the present disclosure are not limited to the examples of the embodiment described above. It should be understood naturally for a person skilled in the art that various alterations, combinations and other embodiment examples may be made without departing from the scope of the present disclosure.

REFERENCE SIGNS LIST 10, 10', 10" cable
11, 12 metal conductor wire
13, 14, 15 optical fiber cable
20, 20', 20" transparent coating
21 upper surface part
21a, 21b shoulder part
22 bottom surface part
23, 24 side face part
25, 26 cut part
27, 28 cavity part
30 connector
40 cable
50 transparent coating
51 upper surface part
52, 53 shoulder part
54, 55 side face part
56 bottom surface part
60 cable
70 transparent coating
71 upper surface plane part
72, 73 side face part
74 bottom surface part
75, 76 notched part
80, 80', 80" cover
81 upper surface part
82 bottom surface part
82a gap (air layer)
83, 84 projection part
83a, 84a step part
89 adhesive
100 display unit
101 housing
102 display panel
103, 104 speaker
105 terminal unit
106 video processing unit
107 audio processing unit
108 control unit
109 power supply unit
200 base unit
201 housing
202 power supply unit
203 tuner unit
204 input interface unit
205 selection unit and decoding unit
206 control unit
207 terminal unit

The invention claimed is:

1. A cable comprising:
at least two metal conductor wires; and
a coating that is made of a transparent or translucent material, covers the at least two metal conductor wires in a state of being arranged in parallel at an interval, and is shaped in a manner that a bottom surface existing along a direction substantially parallel to a direction between the at least two metal conductor wires is a plane and an upper surface is a curved surface with a convex cross section, and two side surfaces existing along a direction perpendicular to the direction between the at least two metal wires are planes that extend from the bottom surface to the upper surface, wherein radii of curvatures of two parts of the upper surface in contact with the plane side surfaces are smaller than a radius of a curvature of the curved surface of the upper surface between the two parts of the upper surface in contact with the side surfaces.

2. The cable according to claim 1,
wherein a light beam incident on the upper surface from a direction vertical to a plane at least including the at least two metal conductor wires is refracted by the upper surface and does not pass through the at least two metal conductor wires.

3. The cable according to claim 2,
wherein, for the upper surface, a vicinity of each metal conductor wire is a curved surface and the curved surface in the vicinity of each metal conductor wire is connected by a plane.

4. The cable according to claim 2,
wherein a curvature of the upper surface is gradually changed so that the same curvature does not continue.

5. The cable according to claim 2,
wherein an optical fiber cable is arranged between the at least two metal conductor wires.

6. The cable according to claim 5,
wherein the coating is made of a material of a refractive index approximate to a refractive index of light of a resin material covering an outer side of the optical fiber cable.

7. The cable according to claim 2,
wherein the upper surface having the curved surface of the coating is a different member made of a transparent material or a translucent material.

8. The cable according to claim 7,
wherein a layer of a different refractive index is provided between the coating and the different member.

9. The cable according to claim 8,
wherein the layer of the different refractive index is an air layer.

10. The cable according to claim 1,
wherein a cut or a cavity is provided between the curved surface with the convex cross section of the coating and an arrangement part of the metal conductor wire.

11. An electronic device composed of a first unit and a second unit, the electronic device comprising:
two metal conductor wires; and
a coating that is made of a transparent or translucent material, covers the two metal conductor wires in a state of being arranged in parallel at an interval, and is shaped in a manner that a bottom surface of the coating existing along a direction substantially parallel to a direction between the two metal conductor wires is a plane and an upper surface is a curved surface with a convex cross section, and two side surfaces of the coating existing along a direction perpendicular to the direction between the two metal conductor wires are planes that extend from the bottom surface to the upper surface,
wherein radii of curvatures of two parts of the upper surface in contact with the plane side surfaces are smaller than a radius of curvature of the upper surface between the two parts of the upper surface in contact with the side surfaces, and
wherein together the two metal conductor wires and the coating form a cable that connects the first unit and the second unit.

12. The electronic device according to claim 11,
wherein a light beam incident on the curved surface from a direction vertical to a plane at least including the two metal conductor wires is refracted by the curved surface and does not pass through the two metal conductor wires.

13. The electronic device according to claim 12,
wherein the first unit includes a power supply unit,
wherein the second unit includes a display panel, and
wherein power supply obtained in the power supply unit of the first unit is supplied to the second unit through the two metal conductor wires of the cable.

14. The electronic device according to claim 13,
wherein an optical fiber cable is arranged between the two metal conductor wires, and
wherein video data obtained in the first unit is supplied to the second unit through the optical fiber cable.

15. A cable comprising:
a metal conductor wire; and
a coating that is made of a transparent or translucent material, covers the metal conductor wire, and is shaped in a manner that an upper surface existing along a direction substantially parallel to the metal conductor wire is a curved surface with a convex cross section and two side surfaces existing along a direction perpendicular to the metal conductor wire are planes that extend from the bottom surface to the upper surface,
wherein radii of curvatures of two pans of the upper surface in contact with the two plane side surfaces are smaller than a radius of curvature of the upper surface between the two pans of the upper surface in contact with the side surfaces.

16. An electronic device composed of a first unit and a second unit, the electronic device comprising:
a metal conductor wire; and
a coating that is made of a transparent or translucent material, covers the metal conductor wire, and is shaped in a manner that an upper surface existing along a direction substantially parallel to the metal conductor wire is a curved surface with a convex cross section, and two side surfaces existing along a direction perpendicular to the metal conductor wire are planes that extend from the bottom surface to the upper surface,
wherein radii of curvatures of two parts of the upper surface in contact with the two plane side surfaces are smaller than a radius of curvature of the upper surface between the two parts of the upper surface in contact with the side surfaces,
as a cable that connects the first unit and the second unit.

17. The cable according to claim 1,
wherein the two side surfaces are provided with notched parts and the upper surface is provided with projections in longitudinal direction of the cable.

* * * * *